United States Patent
Eristoff et al.

(10) Patent No.: US 6,699,788 B2
(45) Date of Patent: Mar. 2, 2004

(54) METHOD FOR INTEGRATED NUCLEATION AND BULK FILM DEPOSITION

(75) Inventors: Guy Eristoff, Singapore (SG); Sarion C. S. Lee, Singapore (SG); Liew San Leong, Singapore (SG); Goh Khoon Meng, Singapore (SG)

(73) Assignee: Chartered Semiconductors Manufacturing Limited, Singapore (SG)

(*) Notice: Subject to any disclaimer, the term of this patent is extended or adjusted under 35 U.S.C. 154(b) by 65 days.

(21) Appl. No.: 10/012,299

(22) Filed: Nov. 13, 2001

(65) Prior Publication Data

US 2003/0096499 A1 May 22, 2003

(51) Int. Cl.[7] .............................................. H01L 21/44
(52) U.S. Cl. ..................... 438/679; 438/654; 438/655; 438/656; 438/658; 438/685; 427/569; 427/570; 427/573
(58) Field of Search ................................ 438/679, 656, 438/654, 658, 655, 685; 427/569, 570, 573, 255.5

(56) References Cited

U.S. PATENT DOCUMENTS

| | | | | |
|---|---|---|---|---|
| 5,866,213 A | * | 2/1999 | Foster et al. | ................. 427/573 |
| 6,113,699 A | * | 9/2000 | Hansen | ....................... 118/715 |
| 6,309,966 B1 | * | 10/2001 | Govindarajan et al. | ..... 438/656 |

* cited by examiner

Primary Examiner—David Nelms
Assistant Examiner—Reneé R. Berry

(57) ABSTRACT

An integrated nucleation and bulk deposition process is disclosed for forming a CVD metal film over a semiconductor substrate that has structures formed thereon. In the integrated deposition process of the present invention, nucleation seed deposition and bulk deposition are performed in an integrated and contemporaneous manner. In one embodiment, a reactant gas and a reducing agent gas flow into a pressurized reaction chamber. As the integrated deposition process progresses, pressure and flow of reactant gas are increased while flow of reducing agent gas is decreased. The integrated deposition process of the present invention gives a significant decrease in process time as compared to prior art processes. Moreover, the integrated deposition process of the present invention gives good fill characteristics while providing sufficient protection to underlying structures.

20 Claims, 8 Drawing Sheets

100

PERFORM INTEGRATED
NUCLEATION SEED DEPOSITION AND
BULK DEPOSITION PROCESS
101

FIG. 1

METHOD FOR INTEGRATED NUCLEATION AND BULK FILM DEPOSITION

BACKGROUND OF THE INVENTION

1. Field of the Invention

The present invention relates to the field of semiconductor devices. More particularly, the present invention relates to a method for forming a CVD metal film.

2. Related Art

In conventional in Complimentary Metal Oxide Semiconductor (CMOS) device fabrication processes, semiconductor devices are formed on a semiconductor substrate using a thin gate oxide layer that forms gates between conductive regions in the semiconductor substrate. Overlying metal interconnect structures provide for electrical connection to the underlying semiconductor devices.

CVD metal films are formed in Damascene structures or in blanket films which are subsequently patterned and etched by a variety of chemical, mechanical, plasma, or wet processing steps. The resultant metal interconnect structures provide electrically active pathways for integrated circuits.

Conventional methods for forming CVD metal films use a two-step process. First, a nucleation seed layer is deposited. The nucleation seed layer is critical to device protection and step coverage of the CVD metal film.

This is followed by bulk deposition. The bulk deposition step provides the required thickness of the CVD metal film. In conventional processes, an aggressive precursor is used such as, for example, a halogenated gas. The nucleation seed layer protects the underlying structure from damage during the subsequent bulk deposition step. If the nucleation layer has insufficient thickness or coverage, the halogenated gas will damage the underlying structure(s).

The nucleation film is counterproductive to getting good bulk deposition. More particularly, when too thick of a nucleation layer is used, the resulting bulk deposition does not have good fill characteristics. However, when the nucleation layer is insufficient, though good fill characteristics are obtained, there is insufficient device protection that can lead to device damage and device failure.

In a typical semiconductor manufacturing process, nucleation and bulk deposition processes are performed sequentially as separate process steps. There is typically a pause between the step of depositing the nucleation seed layer and the bulk deposition step. The termination of the step of depositing the nucleation seed layer and the pause between the nucleation and bulk deposition steps affects manufacturability. More particularly, the pause results in increased process time. This adds to the cost of manufacturing semiconductor devices.

What is needed is a way to obtain a CVD metal film that has both good fill characteristics and device protection. In addition, a method is required that meets the above need and that provides for reduced process time. The present invention provides a solution to the above needs.

SUMMARY OF THE INVENTION

The present invention provides a method for forming a CVD metal film that has good fill characteristics and that does not damage underlying devices and structures. In addition, the method of the present invention reduces process time, hence giving manufacturability and cost improvements.

An integrated nucleation and bulk deposition process is disclosed. In the integrated deposition process of the present invention, nucleation seed deposition and bulk deposition are performed in an integrated and contemporaneous manner. In the present embodiment, nucleation seed deposition and bulk deposition are performed in a continuous multi-step process flow to achieve a CVD metal film having good fill characteristics and adequate protection of any underlying structures. Because nucleation and bulk deposition are performed contemporaneously, there is no separation between the process of nucleation and bulk deposition as occurs in prior art processes.

In one embodiment, structures are formed on a semiconductor substrate. The semiconductor substrate is then placed into a reaction chamber. In one embodiment, the reaction chamber is a chemical vapor deposition reaction chamber. The reaction chamber is then pressurized.

Flow of a reactant gas into the reaction chamber is then initiated. In the present embodiment, the reactant gas is tungsten hexafloride. Alternatively, other reactant gasses could be used such as, for example, titanium tetrachloride. Flow of a reducing agent gas into said reaction chamber is also initiated. In one embodiment, the reducing agent gas includes hydrogen gas and silane gas. However, alternatively, other reducing agents could be used such as, for example, $NH_3$. In the present invention, flow of reactant gas is contemporaneous with the flow of reducing agent gas in a continuous process flow so as to form a CVD metal film over the structures formed on the semiconductor substrate.

As the integrated deposition process progresses, flow of reactant gas is increased and flow of reducing agent gas is decreased. Also, as the integrated deposition process progresses, pressure is increased. In, the present embodiment, flow of reactant gas, flow of reducing agent gas and pressure are incrementally changed a number of times throughout the integrated deposition process.

The integrated deposition process of the present invention gives a significant decrease in process time as compared to prior art processes. This results in cost savings. In one embodiment, the method of the present invention provides process time savings of over 25 percent as compared to prior art processes. This is significant, particularly in light of the fact that the process of the present invention is performed five to six times during the fabrication of a typical semiconductor chip.

The method of the present invention provides an additional degree of freedom that is not present in prior art processes which is the ability to trade off flow of reacting agent (and reducing agent) with total pressure. Moreover, the method of the present invention allows for reactant and reactant agent flows, partial pressures and total pressure to be continuously and simultaneously modulated in-situ. Thus, in the present invention, different growth mechanisms are combined, allowing for superior device protection while keeping less conformal growth mechanisms to a minimum thickness, thereby maximizing step coverage and film conformity. This allows for optimization of fill characteristics relative to protection requirements. Thereby, a CVD metal film can be obtained having superior fill characteristics as compared to prior art processes.

Accordingly, the integrated deposition process of the present invention gives good fill characteristics while providing sufficient protection to underlying structures. In addition, the method of the present invention provides for reduced process time as compared to prior art processes.

These and other objects and advantages of the present invention will become obvious to those of ordinary skill in the art after having read the following detailed description of the preferred embodiments that are illustrated in the various drawing figures.

BRIEF DESCRIPTION OF THE DRAWINGS

FIG. 1 shows a method for forming a CVD metal film in accordance with an embodiment of the present invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

FIG. 1 shows a method for forming a CVD metal film in accordance with one embodiment of the present invention. As shown by step 101, an integrated deposition process is performed in which nucleation seed deposition and bulk deposition are performed in an integrated and contemporaneous manner.

In the present embodiment, reducing agent gas and reactant agent gas are introduced into a pressurized environment in a contemporaneous manner in a continuous process flow so as to produce a CVD metal film that has both good fill characteristics and that sufficiently protects any underlying structures.

Figure 2:
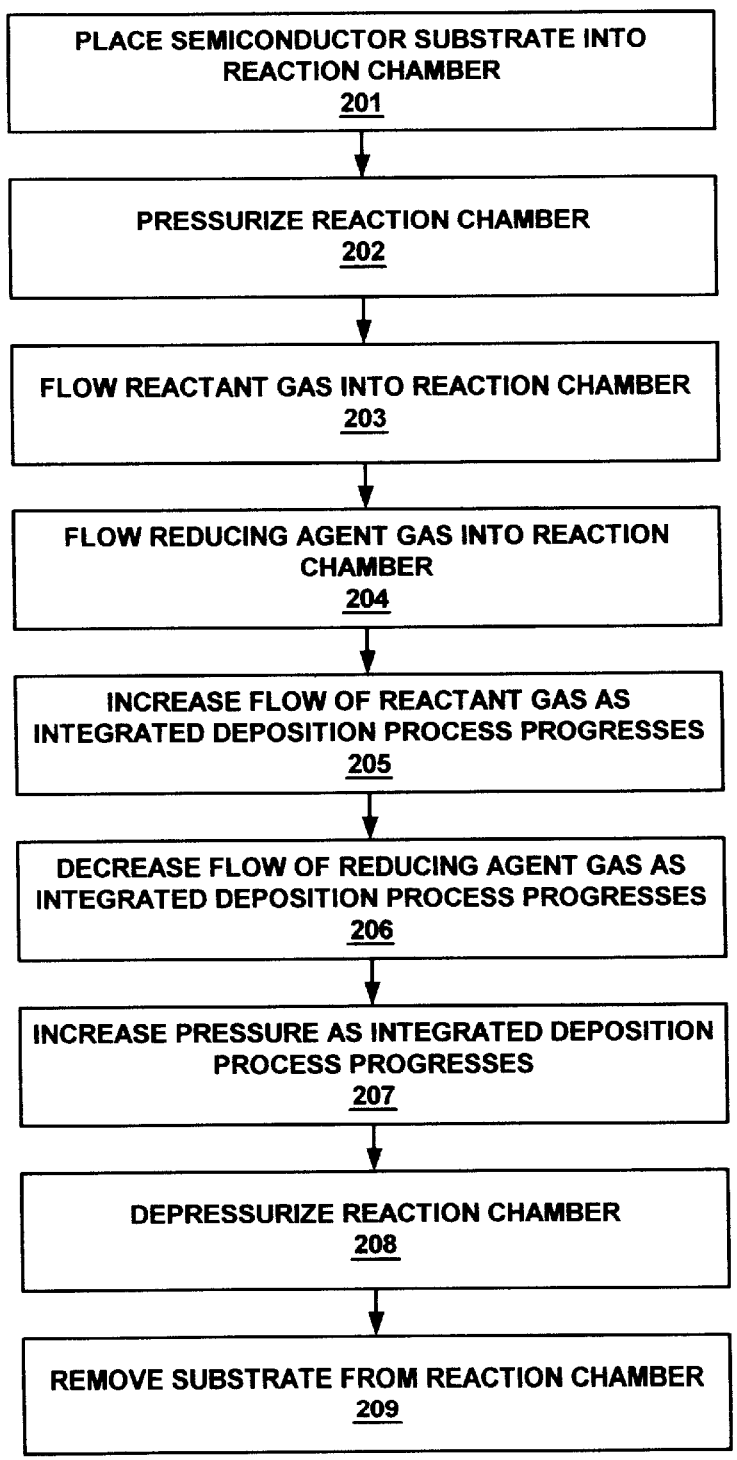
FIG. 2 shows a more detailed method for forming a CVD metal film in accordance with an embodiment of the present invention.

In one embodiment that is illustrated in FIG. 2, a semiconductor substrate over which the CVD metal film is to be formed is placed into a reaction chamber (step 201). In one embodiment, the reaction chamber is a chemical vapor deposition reaction chamber.

The reaction chamber is then pressurized as shown by step 202. In the present embodiment, the reaction chamber is pressurized to an initial pressure of 4.5 Torr.

Flow of a reactant gas into the reaction chamber is then initiated as is shown by step 203. Although any of a number of different types of reactant gas could be used as a reactant agent, in the present embodiment tungsten hexafloride ($WF_6$) is used as a reactant agent.

Flow of a reducing agent gas into the reaction chamber is initiated as shown by step 204. In the present embodiment, the reducing agent gas includes a first reducing agent that is silane gas and a second reducing agent that is hydrogen gas. However, alternatively, other reducing agents could be used.

Referring now to step 205, flow of the reactant gas is increased as the integrated deposition process progresses. Accordingly, in the present embodiment, the flow of reactant/reducer gas is increased as the integrated deposition process progresses. In one specific embodiment of the present invention, flow of reactant/reducer gas is initially approximately 30 standard cubic centimeters per minute and the flow of gas is increased to approximately 120 standard cubic centimeters per minute as the integrated deposition process progresses.

Referring now to step 206, flow of the reducing agent gas is decreased as the integrated deposition process progresses. Accordingly, in the present embodiment, flow of a first reducing agent is decreased as the integrated deposition process progresses. Also, flow of a second reducing agent is decreased as the integrated deposition process progresses. In one embodiment of the present invention, flow of the first reducing agent is initially approximately 15 standard cubic centimeters per minute and the flow of the first reducing agent is decreased to zero as the integrated deposition process progresses. In this embodiment, flow of the second reducing agent is initially approximately 4000 standard cubic centimeters per minute and the flow of the second reducing agent is decreased to approximately 1000 standard cubic centimeters per minute as the integrated deposition process progresses.

Continuing with FIG. 2 as shown by step 207, pressure within the reaction chamber is increased as the integrated deposition process progresses. In one embodiment of the present invention, pressure within the reaction chamber is initially in the range of approximately 4.5 Torr and the pressure increases as the deposition process progresses to approximately 90 Torr.

The reaction chamber is then depressurized as shown by step 208. More particularly, the reaction chamber is allowed to return to atmospheric pressure. The substrate is then removed from the reaction chamber as shown by step 209.

In the present embodiment, the pressure within the reaction chamber is incrementally increased a number of times throughout the integrated deposition process. In the embodiment shown in FIGS. 5–6 pressure is increased a total of 8 times. However, pressure could be increased more or fewer times, or could be continually incrementally adjusted.

Figure 5:
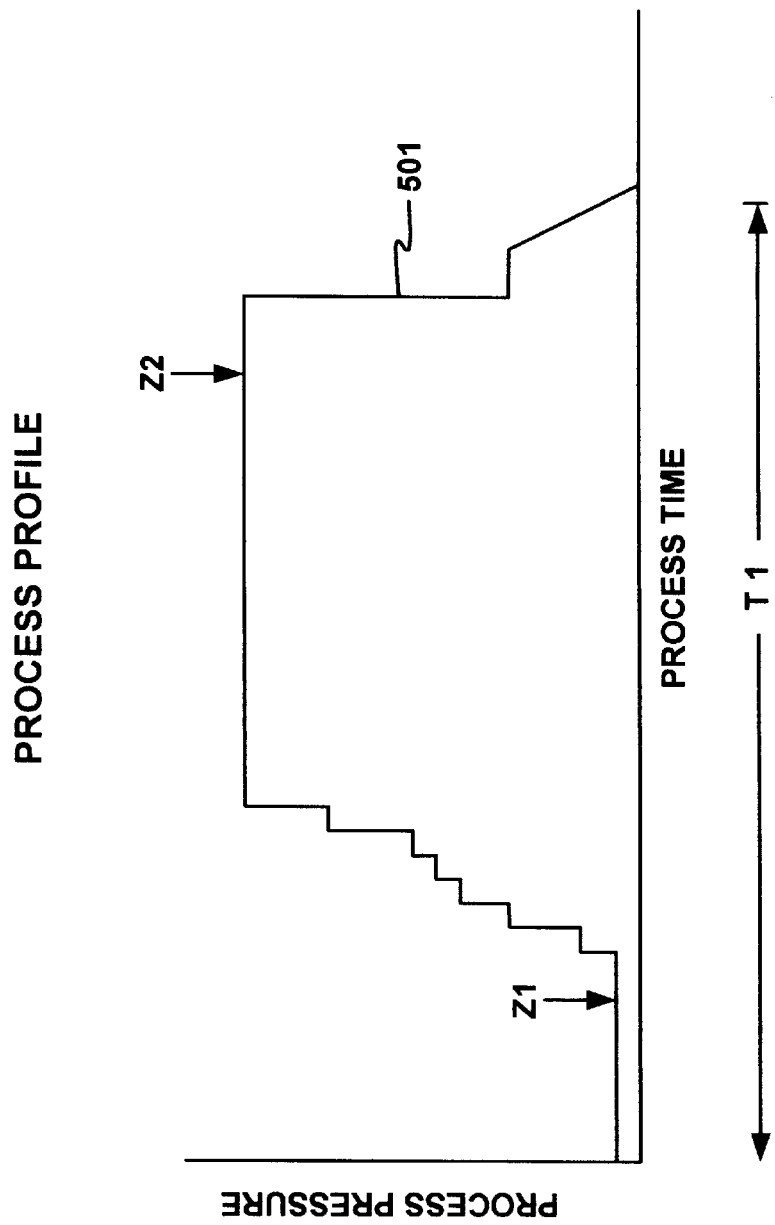
FIG. 5 is a graph that shows an exemplary process profile in accordance with an embodiment of the present invention.
Figure 6:
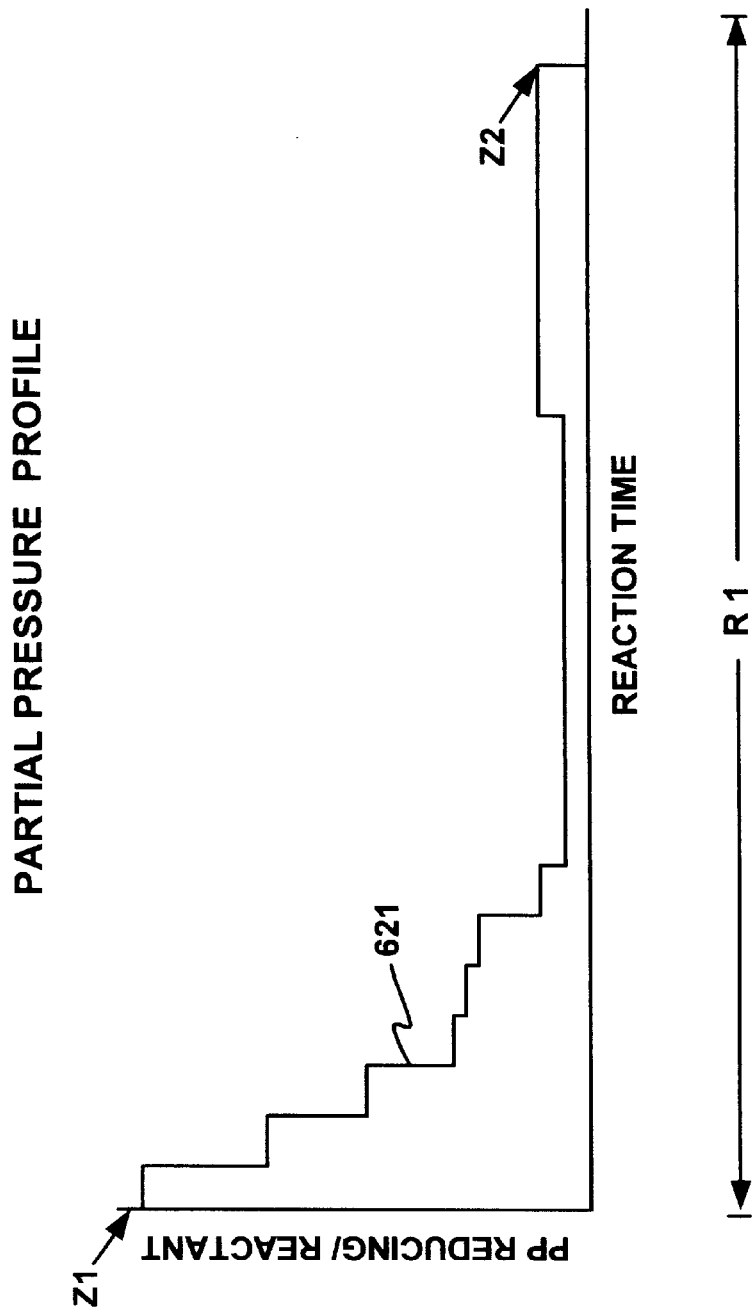
FIG. 6 is a graph that shows an exemplary partial pressure profile in accordance with an embodiment of the present invention.

In the present invention, flow of reactant gas is contemporaneous with the flow of reducing agent gas in a continuous process flow so as to form a CVD metal film over the structures formed on the semiconductor substrate. In one embodiment that is illustrated in FIGS. 5–6, flow of reactant gas and flow of reducing agent gas are simultaneously initiated to begin the integrated deposition process. Both reactant gas and reducing agent gas simultaneously flow into the reaction chamber and react to produce a CVD film upon the substrate. The flow of reactant gas and reducing agent gas are then altered so as to produce optimal fill characteristics while obtaining sufficient protection for underlying structures.

Figure 3:
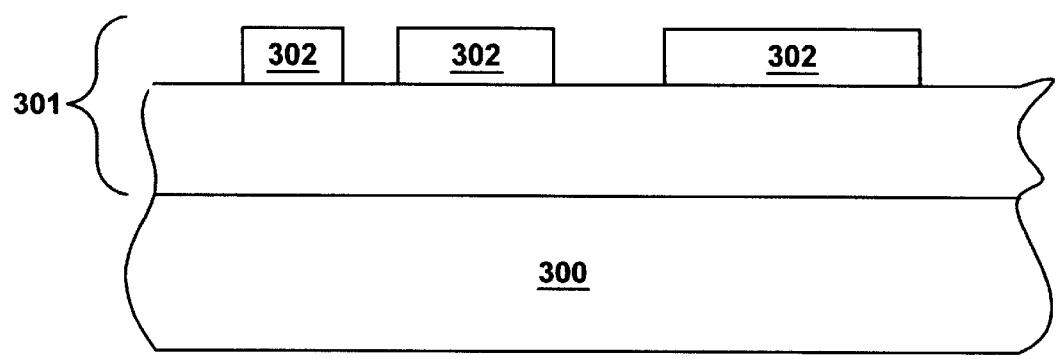
FIG. 3 a side cut-away view of a semiconductor substrate having devices formed thereover and having interconnect structures formed thereon in accordance with an embodiment of the present invention.

FIG. 3 shows an exemplary structure 301 over which integrated deposition process 100 of FIG. 1 and integrated deposition process 200 of FIG. 2 can be performed. In the present embodiment, structure 301 is formed over semiconductor substrate 300. In the present embodiment, structures 301 include semiconductor devices (not shown) that are formed on silicon substrate 300. In one embodiment, semiconductor devices are formed using an ultra-thin oxide layer (not shown) that extends between conductive regions formed within the silicon substrate 300. In the present embodiment, structures 301 include active structures 302 that are selectively electrically connected to the underlying semiconductor devices. In the present embodiment, active structures 302 are transistors.

It is appreciated that structure 301 formed on semiconductor substrate 300 is representative of structures over which a CVD metal film can be formed in accordance with method 100 of FIG. 1 and method 200 of FIG. 2. However, method 100 of FIG. 1 and method 200 of FIG. 2 are well adapted for use with other types of structures.

Figure 4:
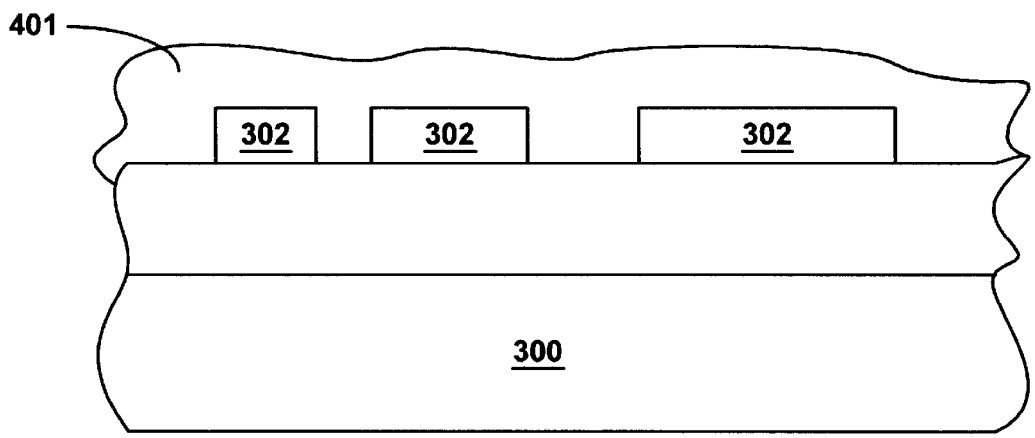
FIG. 4 is a diagram that illustrates the deposition of a CVD metal film over the structure of FIG. 3 in accordance with an embodiment of the present invention.

Referring now to FIG. 4, the structure of FIG. 3 is shown after method 100 of FIG. 1 or method 200 of FIG. 2 has been performed so as to produce a CVD metal film 401 that directly overlies structure 301 of FIG. 3. It can be seen that CVD metal film 401 has good fill characteristics and step coverage.

In one specific embodiment of the present invention, pressure (in Torr) and flow of reducing agents (in Standard Cubic Centimeters per Minute (SCCM)) and reactant agents are varied incrementally in eight steps. In the first step, a total pressure of 4.5 Torr is used along with a reactant agent flow of 30 SCCM, a first reducing agent flow of 15 SCCM and a second reducing agent flow of 4000 SCCM. In the second step a total pressure of 10 Torr is used along with a reactant agent flow of 30 SCCM, a first reducing agent flow of 15 SCCM and a second reducing agent flow of 4000 SCCM. In the third step a total pressure of 30 Torr is used along with a reactant agent flow of 30 SCCM, a first reducing agent flow of 15 SCCM and a second reducing agent flow of 4000 SCCM. In the fourth step a total pressure of 40 Torr is used along with a reactant agent flow of 30 SCCM, a first reducing agent flow of 10 SCCM and a second reducing agent flow of 2000 SCCM. In the fifth step a total pressure of 45 Torr is used along with a reactant agent flow of 30 SCCM, a first reducing agent flow of zero and a second reducing agent flow of 2000 SCCM. In the sixth step a total pressure of 50 Torr is used along with a reactant agent flow of 30 SCCM, a first reducing agent flow of zero and a second reducing agent flow of 2000 SCCM. In the seventh step a total pressure of 70 Torr is used along with a reactant agent flow of 80 SCCM, a first reducing agent flow of zero and a second reducing agent flow of 2000 SCCM. In the eighth step a total pressure of 90 Torr is used along with a reactant agent flow of 120 SCCM, a first reducing agent flow of zero and a second reducing agent flow of 1000 SCCM. The chart that follows illustrates the eight step process of this embodiment.

|  | Step | | | | | | | |
| --- | --- | --- | --- | --- | --- | --- | --- | --- |
|  | 1 | 2 | 3 | 4 | 5 | 6 | 7 | 8 |
| Total Pressure | 4.5 | 10 | 30 | 40 | 45 | 50 | 70 | 90 |
| Reactant Agent Flow | 30 | 30 | 30 | 30 | 30 | 30 | 80 | 120 |
| First Reducing Agent Flow | 15 | 15 | 15 | 10 | 0 | 0 | 0 | 0 |
| Second Reducing Agent flow | 4000 | 4000 | 4000 | 2000 | 2000 | 2000 | 2000 | 1000 |

Though the present embodiment is described as an eight step process, it is appreciated that more or fewer steps could be used and that different pressures and flow levels could be used. In addition, though the present embodiment is described in the form of steps, the steps, taken together, form a continuous process flow in which a single CVD metal layer is formed. In an alternate embodiment (not illustrated), changes are uniformly incremental instead of stepped.

FIG. 5 shows an exemplary process profile 501 in accordance with one embodiment of the present invention. In this illustration, process pressure (total pressure) is indicated on the vertical axis and process time is indicated on the horizontal axis. In this embodiment, flow of reactant gas and reducing agent gasses (steps 202 and 203 of FIG. 2) are simultaneously initiated beginning at point z1. All gas flow for both reactant gas and reducing agent gasses is shown to end at point z2. The pressure is then reduced to atmospheric pressure. This gives a process time indicated by arrow T1. In one embodiment of the present invention, method 100 of FIG. 1 and method 200 of FIG. 2 give a process time T1 of approximately 94 seconds.

FIG. 6 shows an exemplary partial pressure profile 601 in accordance with one embodiment of the present invention. In this embodiment, flow of reactant gas and flow of reducing agent gas begin at point Z1 and end at point Z2. In this illustration, reaction time is indicated on the horizontal axis and partial pressure of the reactant agents divided by the partial pressure of the reactant is shown on the vertical axis. Calculation of partial pressures for the vertical axis is determined by taking the partial pressure of hydrogen to the ½ power plus partial pressure of silane to the first power, all divided by the partial pressure of the reactant (here $WF_6$) to the first power as shown in the following equation:

$$\frac{\left(\sqrt{ppH_2} + ppSiH_4\right)}{ppWF_6}.$$

Figure 7:
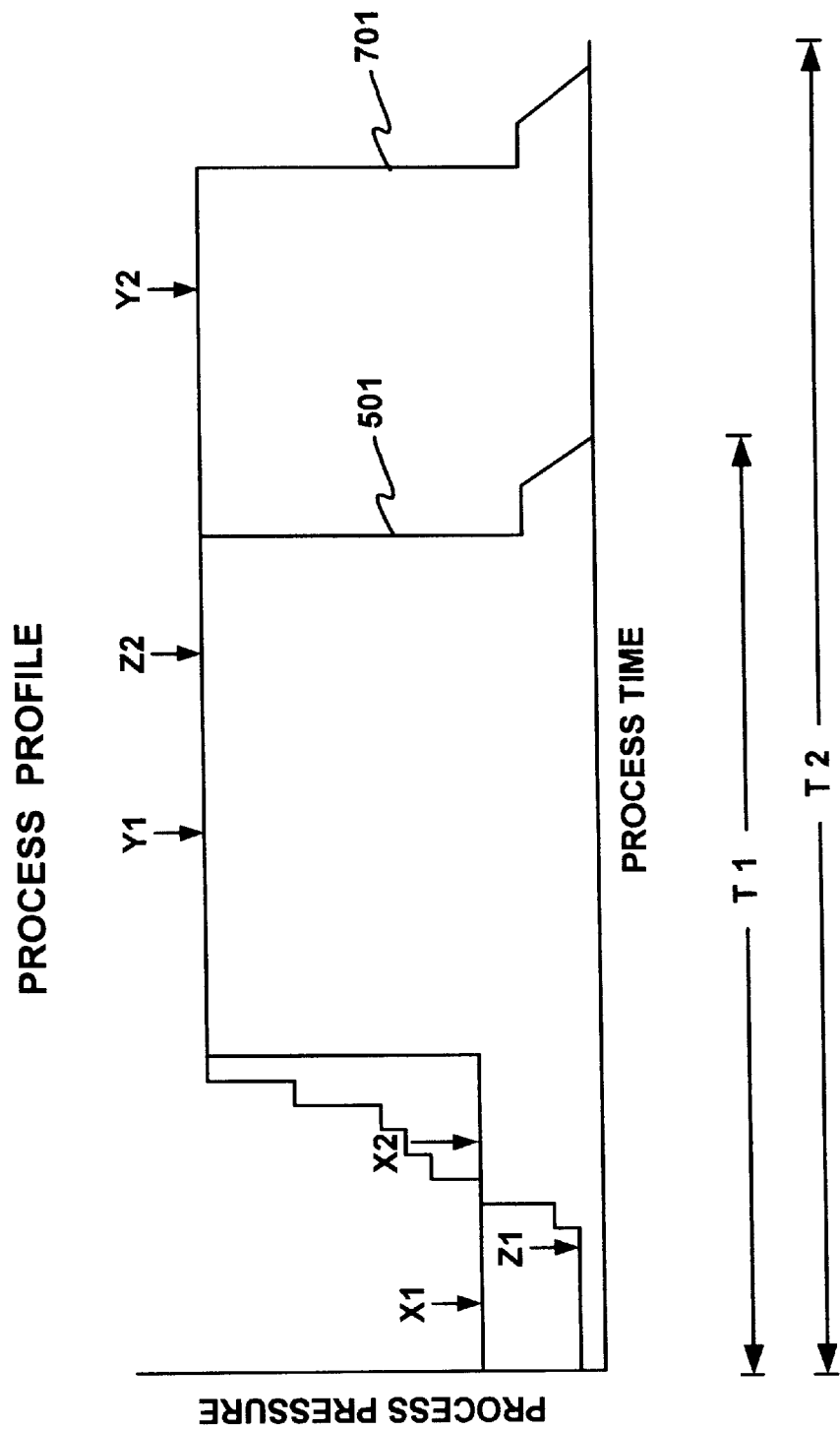
FIG. 7 is a graph that compares the process profile of FIG. 5 to a typical prior art process profile.

FIG. 7 compares exemplary process profile 501 of FIG. 5 to a typical prior art process, illustrated by process profile 701. Nucleation begins at point x1 and ends at point x2. There is a time lag while pressure is increased. Then, bulk deposition begins at point y1. The bulk deposition process then ends at point y2, followed by depressurization to give a process time of T2 (approximately 130 seconds) for the exemplary prior art process. It can be seen that the process time T1 of the present invention is significantly less than the process time T2 of the exemplary prior art process.

Figure 8:
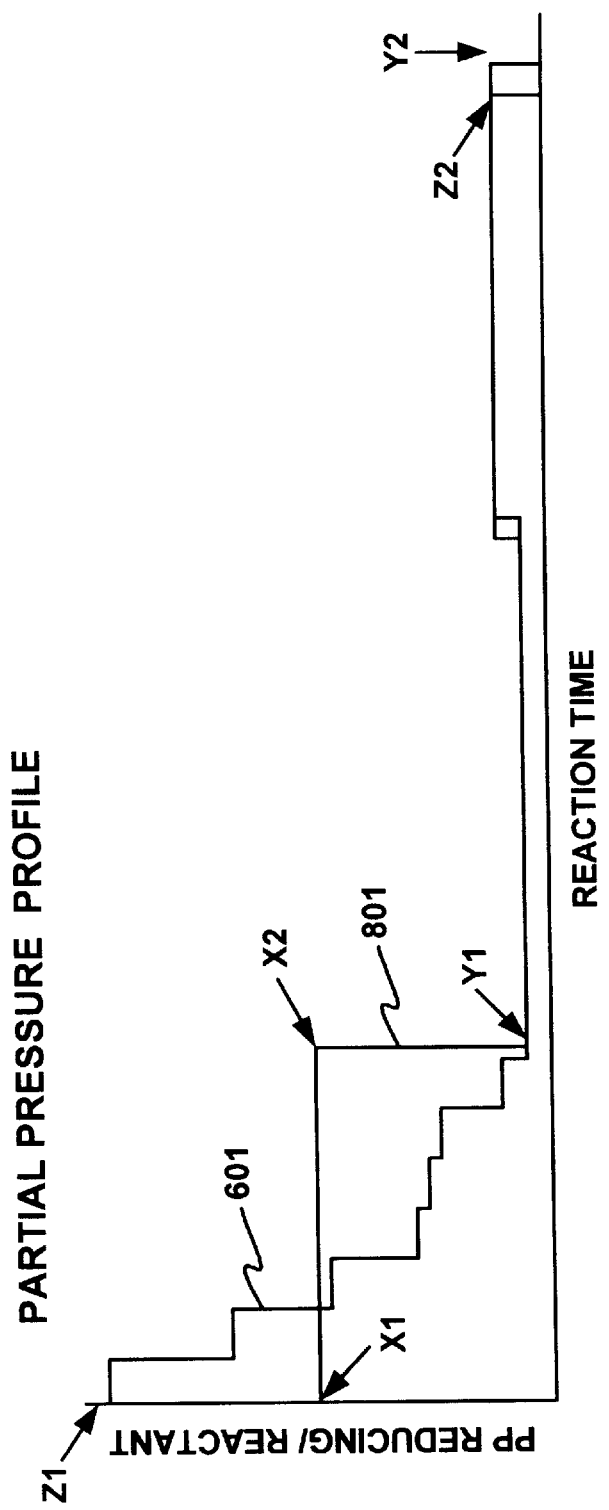
FIG. 8 is a graph that compares the partial pressure profile of FIG. 6 to a typical prior art partial pressure profile.

FIG. 8 shows the exemplary partial pressure profile of FIG. 6 as compared to a prior art process, illustrated by partial pressure profile 801. In this embodiment, Nucleation begins at point x1 and ends at point x2. Bulk deposition begins at point y1 and ends at point y2. This illustration only shows reaction time. Hence, it does not take into account time between the end of the nucleation step, represented by point x2 and the beginning of the bulk deposition step, represented by point y1. Thus, it can be seen that the process of the present invention is quicker than exemplary prior art process 801, even when the time between nucleation and bulk deposition is not taken into account.

The integrated deposition process of the present invention gives a significant decrease in process time as compared to prior art processes. This results in cost savings. In one embodiment, the method of the present invention provides process time savings of over 25 percent as compared to prior art processes. This is significant, particularly in light of the fact that the process of the present invention is performed five to six times during the fabrication of a typical semiconductor chip.

The method of the present invention provides an additional degree of freedom that is not present in prior art processes which is the ability to trade off flow of reacting agent (and reducing agent) with total pressure. Moreover, the method of the present invention allows for reactant and reactant agent flows, partial pressures and total pressure to be continuously and simultaneously modulated in-situ.

In the present invention, different growth mechanisms are combined, allowing for superior device protection while keeping less conformal growth mechanisms to a minimum thickness, thereby maximizing step coverage and film conformity. This allows for optimization of fill characteristics relative to protection requirements. Thereby, a CVD metal film can be obtained having superior fill characteristics as compared to prior art processes.

Accordingly, the integrated deposition process of the present invention gives good fill characteristics while providing sufficient protection to underlying structures. In addition, the method of the present invention provides for reduced process time as compared to prior art processes.

While the present invention has been described in particular embodiments, it should be appreciated that the present invention should not be construed as limited by such embodiments, but rather construed according to the below claims.

What is claimed is:

1. A method for forming a CVD metal film comprising the step of performing an integrated deposition process, said integrated deposition process including nucleation seed deposition and bulk deposition, said nucleation seed deposition and said bulk deposition performed in an integrated and contemporaneous manner.

2. The method of claim 1 wherein said integrated deposition process includes the integrated and contemporaneous deposition of reducing agent gas and reactant gas in a pressurized environment.

3. The method of claim 2 wherein said reactant gas comprises a Halogenated gas.

4. The method of claim 3 wherein said Halogenated gas further comprises tungsten hexafloride and wherein the flow of said tungsten hexafloride is increased as said integrated deposition process progresses.

5. The method of claim 3 wherein said reducing agent gas comprises hydrogen and wherein flow of said hydrogen is decreased as said integrated deposition process progresses.

6. The method of claim 5 wherein said reducing agent gas comprises silane and wherein flow of said silane is decreased as said integrated deposition process progresses.

7. The method of claim 3 wherein the pressure within said reaction chamber is increased as said integrated deposition process progresses.

8. The method of claim 7 wherein said pressure within said reaction chamber is initially in the range of approximately 4.5 Torr and wherein said pressure increases as said deposition process progresses to approximately 90 Torr.

9. The method of claim 6 wherein said flow of said silane is initially approximately 15 standard cubic centimeters per minute and wherein said flow of said silane is decreased to zero as said integrated deposition process progresses.

10. The method of claim 4 wherein said flow of said tungsten hexafloride is initially approximately 30 standard cubic centimeters per minute and wherein said flow of said tungsten hexafloride is increased to approximately 120 standard cubic centimeters per minute as said integrated deposition process progresses.

11. A method for forming a CVD metal film over a semiconductor substrate having structures formed thereon, said method comprising the step of performing an integrated deposition process, said integrated deposition process including nucleation seed deposition and bulk deposition, said nucleation seed deposition and said bulk deposition performed in an integrated and contemporaneous manner by the integrated and contemporaneous deposition of reactant and reducing agent gasses in a pressurized deposition chamber.

12. The method of claim 11 wherein said reducing agent gas comprises hydrogen and wherein flow of said hydrogen is decreased as said integrated deposition process progresses.

13. The method of claim 12 wherein said reducing agent gas comprises silane and wherein flow of said silane is decreased as said integrated deposition process progresses.

14. The method of claim 13 wherein said reactant agent comprises tungsten hexafloride and wherein flow of said tungsten hexafloride is increased as said integrated deposition process progresses.

15. The method of claim 14 wherein pressure within said reaction chamber is increased as said integrated deposition process progresses.

16. The method of claim 15 wherein said pressure within said reaction chamber is initially in the range of approximately 4.5 Torr and wherein said pressure increases as said deposition process progresses to approximately 90 Torr.

17. The method of claim 16 wherein said flow of said hydrogen is initially approximately 4000 standard cubic centimeters per minute and wherein said flow of said hydrogen is increased to approximately 1000 standard cubic centimeters per minute as said integrated deposition process progresses.

18. The method of claim 17 wherein said flow of said silane is initially approximately 15 standard cubic centimeters per minute and wherein said flow of said silane is decreased to zero as said integrated deposition process progresses.

19. The method of claim 18 wherein said flow of said tungsten hexafloride is initially approximately 30 standard cubic centimeters per minute and wherein said flow of said tungsten hexafloride is increased to approximately 120 standard cubic centimeters per minute as said integrated deposition process progresses.

20. An integrated nucleation and bulk deposition process comprising the steps of:

introducing a semiconductor substrate having structures formed thereon into a reaction chamber;

pressurizing said reaction chamber;

flowing a reactant gas into said reaction chamber, said reactant gas comprising tungsten hexafloride;

flowing a reducing agent gas into said reaction chamber, said reducing agent gas comprising hydrogen and comprising silane;

increasing flow of said reactant gas as said integrated deposition process progresses;

decreasing flow of said reducing agent gas as said deposition process progresses;

increasing pressure within said reaction chamber as said deposition process progresses; and wherein flow of said reactant gas is contemporaneous with the flow of said reducing agent gas so as to form a CVD metal film over said structures.

* * * * *